United States Patent
Shin

(10) Patent No.: US 8,054,115 B2
(45) Date of Patent: Nov. 8, 2011

(54) PHASE-LOCKED LOOP INTEGRATED CIRCUITS HAVING DUAL FEEDBACK CONTROL

(75) Inventor: Jong-shin Shin, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 127 days.

(21) Appl. No.: 12/571,868

(22) Filed: Oct. 1, 2009

(65) Prior Publication Data

US 2010/0085092 A1    Apr. 8, 2010

(30) Foreign Application Priority Data

Oct. 7, 2008    (KR) .................. 10-2008-0098160

(51) Int. Cl.
    *H03L 7/06* (2006.01)
(52) U.S. Cl. .................. 327/157; 327/148
(58) Field of Classification Search .......... 327/148, 327/157
    See application file for complete search history.

(56) References Cited

U.S. PATENT DOCUMENTS

| | | | |
|---|---|---|---|
| 6,829,318 B2* | 12/2004 | Kawahara | 375/376 |
| 7,079,616 B2* | 7/2006 | Castiglione et al. | 375/376 |
| 7,095,287 B2 | 8/2006 | Maxim et al. | |
| 7,356,111 B1* | 4/2008 | Dean | 375/376 |
| 7,659,783 B2* | 2/2010 | Tai | 331/17 |
| 7,701,270 B2* | 4/2010 | Wyatt et al. | 327/157 |
| 7,812,650 B2* | 10/2010 | Song et al. | 327/156 |
| 7,868,808 B2* | 1/2011 | Caplan et al. | 341/144 |
| 2002/0176188 A1 | 11/2002 | Ruegg et al. | |
| 2005/0212605 A1 | 9/2005 | Puma | |
| 2006/0158262 A1* | 7/2006 | Robinson et al. | 331/16 |
| 2010/0085092 A1* | 4/2010 | Shin | 327/157 |
| 2010/0283517 A1* | 11/2010 | Wadhwa et al. | 327/157 |

\* cited by examiner

*Primary Examiner* — Lincoln Donovan
*Assistant Examiner* — Adam Houston
(74) *Attorney, Agent, or Firm* — Myers Bigel Sibley & Sajovec, P.A.

(57) ABSTRACT

Phase-locked loop (PLL) integrated circuits according to embodiments of the invention provide dual feedback control. The first feedback control utilizes a conventional phase locking scheme that passes a feedback clock signal to an input of a phase-frequency detector (PFD). The second feedback control utilizes an automatic frequency calibrator that evaluates a frequency of an output of a voltage-controlled oscillator (VCO) relative to a locked frequency detected during calibration and provides separate calibration control to a charge pump.

15 Claims, 4 Drawing Sheets

PHASE-LOCKED LOOP INTEGRATED CIRCUITS HAVING DUAL FEEDBACK CONTROL

REFERENCE TO PRIORITY APPLICATION

This application claims priority to Korean Patent Application No. 10-2008-0098160, filed Oct. 7, 2008, the contents of which are hereby incorporated herein by reference.

FIELD OF THE INVENTION

The present invention relates to integrated circuit devices and, more particularly, to phase-locked loop integrated circuits.

BACKGROUND

Mismatch in a charge pump corresponds to mismatch between up and down currents and occurs due to a difference between transconductances Gm of a PMOS transistor and an NMOS transistor constructing the charge pump according to PVT (Process-Voltage-Temperature), and mismatch occurring when bias voltages of the transistors are generated.

When mismatch occurs in a charge pump included in a PLL, changes in control voltage of a voltage controlled oscillator (VCO) can cause reference spur and jitter.

SUMMARY

Phase-locked loop (PLL) integrated circuits according to embodiments of the invention provide dual feedback control. The first feedback control utilizes a conventional phase locking scheme that passes a feedback clock signal to an input of a phase-frequency detector (PFD). The second feedback control utilizes an automatic frequency calibrator that evaluates a frequency of an output of a voltage-controlled oscillator (VCO) relative to a locked frequency detected during calibration and provides separate calibration control to a charge pump.

According to some of these embodiments of the invention, the PLL integrated circuit includes a charge pump, which is responsive to up and down control signals and first and second bias signals, and a charge pump calibration circuit. This charge pump calibration circuit includes a current mirror configured to generate the first bias signal and a current source circuit, which is electrically connected to the current mirror and is responsive to a multi-bit calibration signal and the second bias signal. In some embodiments of the invention, the current source circuit includes a plurality of parallel current sources responsive to respective ones of the multi-bit calibration signal. For example, the current mirror may include a PMOS transistor and each of the plurality of parallel current sources may include a respective pair of NMOS transistors. Alternatively, the current mirror may include an NMOS transistor and each of the plurality of parallel current sources may include a respective pair of PMOS transistors.

A voltage-controlled oscillator (VCO) and a frequency calibrator are also provided. The VCO is configured to generate an output signal in response to a control signal generated by the charge pump. The frequency calibrator, which is responsive to the output signal, is configured to change a value of the multi-bit calibration signal in response to detecting changes in a frequency of the output signal. In particular, the frequency calibrator may be automated to adjust the value of the multi-bit calibration signal in response to detecting differences in a frequency of the output signal during normal operation relative to a frequency of the output signal during calibration.

According to still further embodiments of the invention, the PLL may include a phase-frequency detector (PFD) configured to generate the up and down control signals in response to a reference clock signal (REF_CLK) and a feedback clock signal (FB_CLK). To facilitate calibration of the PLL, a selector (e.g., multiplexer) is provided. This selector is configured to pass the reference clock signal as the feedback clock signal in response to a calibration mode signal.

DETAILED DESCRIPTION OF THE EMBODIMENTS

Figure 1:
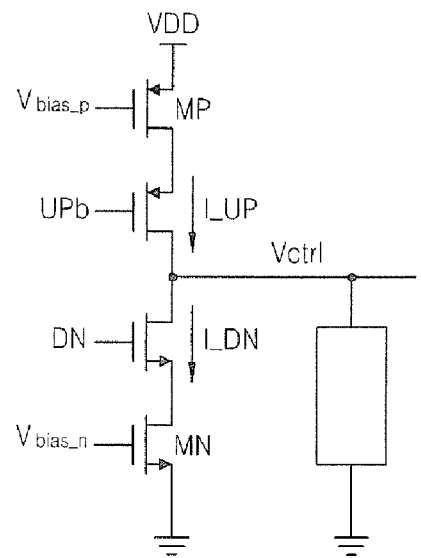
FIG. 1 is a circuit diagram of a conventional charge pump used for a phase locked loop (PLL)

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

FIG. 1 is a circuit diagram of a typical charge pump employed in a phase locked loop (PLL).

Figure 2:
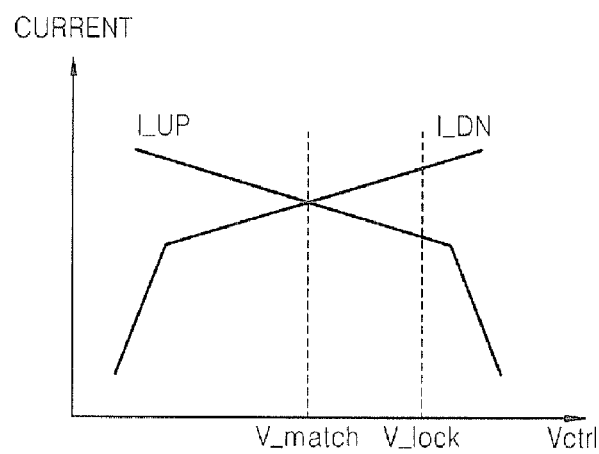
FIG. 2 is a graph for explaining current mismatch of a charge pump.

Referring to FIG. 1, mismatch between a current I_UP flowing through an upper PMOS transistor MP and a current I_DN flowing through a lower NMOS transistor MN occurs according to a difference between transconductances Gm of the transistors MP and MN due to PVT (Process-Voltage-Temperature) and mismatch occurring when bias voltages Vbias_p and Vbias_n of the transistors MP and MN are generated. The currents I_UP and I_DN vary with a voltage Vctrl according to output resistances of the transistors MP and MN, as illustrated in FIG. 2. A voltage V_lock that locks the PLL is determined by characteristic of a voltage controlled oscillator VCO, and thus a voltage V_match at which the voltage V_lock and the currents I_UP and I_DN are matched has no relation to the voltage V_lock, as illustrated in FIG. 2. Accordingly, mismatch may occur if a target frequency varies or the characteristic of the VCO varies to change the voltage V_lock even though the currents I_UP and I_DN become identical according to a PVT variation.

Figure 3:
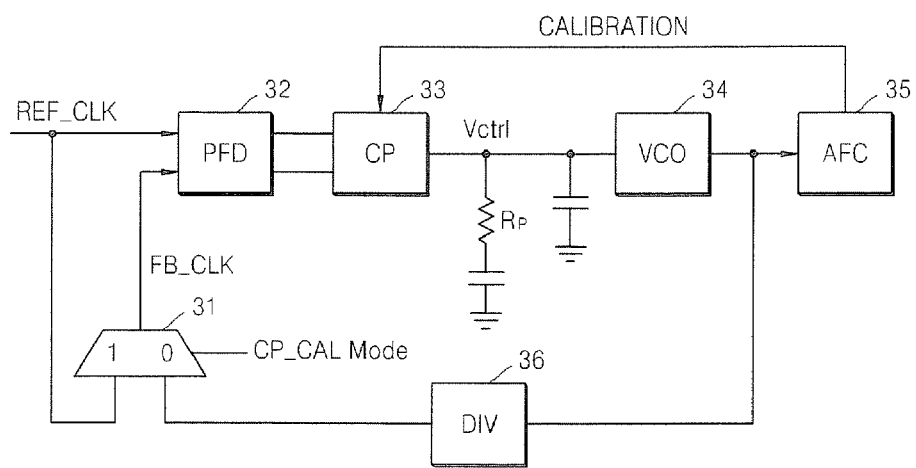
FIG. 3 is a block diagram of a PLL including a charge pump mismatch calibrating apparatus according to an embodiment of the inventive concept.
Figure 4:
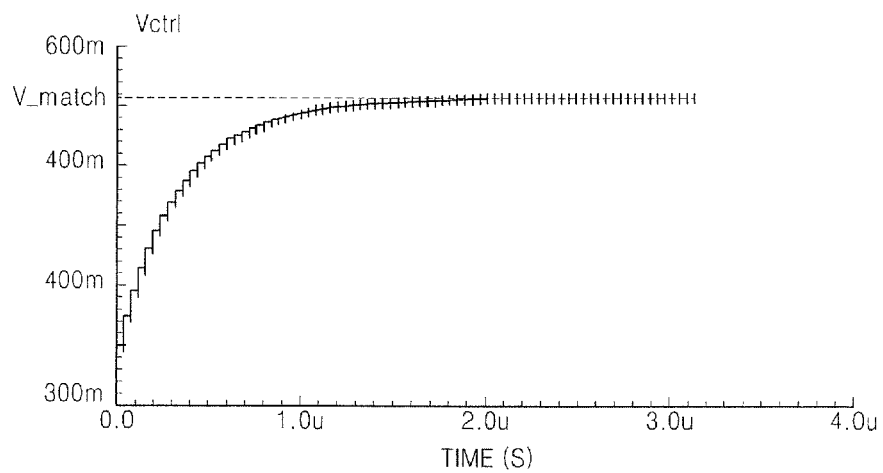
FIG. 4 is a graph illustrating a variation in a voltage Vctrl according to time when a reference clock signal is input to both input terminals of a phase frequency detector in a charge pump calibration mode.

FIG. 3 is a block diagram of a PLL including a charge pump mismatch calibrating apparatus according to an embodiment of the inventive concept.

Referring to FIG. 3, the PLL includes a selector 31, a phase frequency detector (PFD) 32, a charge pump 33, a voltage controlled oscillator (VCO) 34, an automatic frequency calibrator (AFC) 35 and a frequency divider (DIV) 36.

The selector 31 selectively outputs a reference clock signal. REF_CLK input from an external device or a signal input from the frequency divider 36 according to a charge pump calibration mode signal CP_CAL Mode. In the charge pump calibration mode, the reference clock signal REF_CLK is output when the charge pump is calibrated, and the signal input from the frequency divider 36 is output when a PLL operation is performed after calibration.

The PFD 32 detects a phase difference between the reference clock signal REF_CLK and the output signal of the selector 31, FB_CLK, and outputs an UP signal and a DN signal. Here, if the charge pump is to be calibrated, the reference clock signal REF_CLK is input to the PFD 32 and the PFD 32 operates in the same manner as when the PLL is locked. An upper PMOS transistor and the lower NMOS transistor illustrated in FIG. 5 are respectively turned on according to the UPb signal and the DN signal input from the charge pump 33, and thus the currents I_UP and I_DN respectively flow through the upper PMOS transistor and the lower NMOS transistor. The output voltage of the charge pump 33, Vctrl, reaches a voltage V_match at which the currents I_UP and I_DN become identical to each other. When the voltage V_match becomes identical to the voltage V_lock, mismatch between the PFD 32 and the charge pump 33 is eliminated while the PLL is locked.

However, the mismatch between the PFD 32 and the charge pump 33 is not eliminated in practice due to a difference in a process and is delivered to the VCO 34. The output signal of the VCO 34 is transmitted to the AFC 35 in order to compare the voltage V_lock to the voltage V_match. In AFC 35, the output frequency of the VCO 34 is compared with an output frequency when the PLL is locked. The frequency comparison is performed in such a manner that the number of clock pulses output from the VCO 34 for a predetermined period of time is counted and then the counted number is compared to a predetermined value, that is, the number of clock pulses corresponding to the output frequency when the PLL is locked.

If the output frequency of the VCO 34 is higher than the output frequency when the PLL is locked, it means that the voltage V_match is higher than the voltage V_lock. Accordingly, the current I_UP of the charge pump 33 is reduced to decrease the voltage V_match to be matched to the charge pump 33. If the output frequency of the VCO 34 is lower than the output frequency when the PLL is locked, it means that the voltage V_match is lower than the voltage V_lock. Accordingly the current I_UP of the charge pump 33 is increased to enhance the voltage V_match.

Figure 5A:
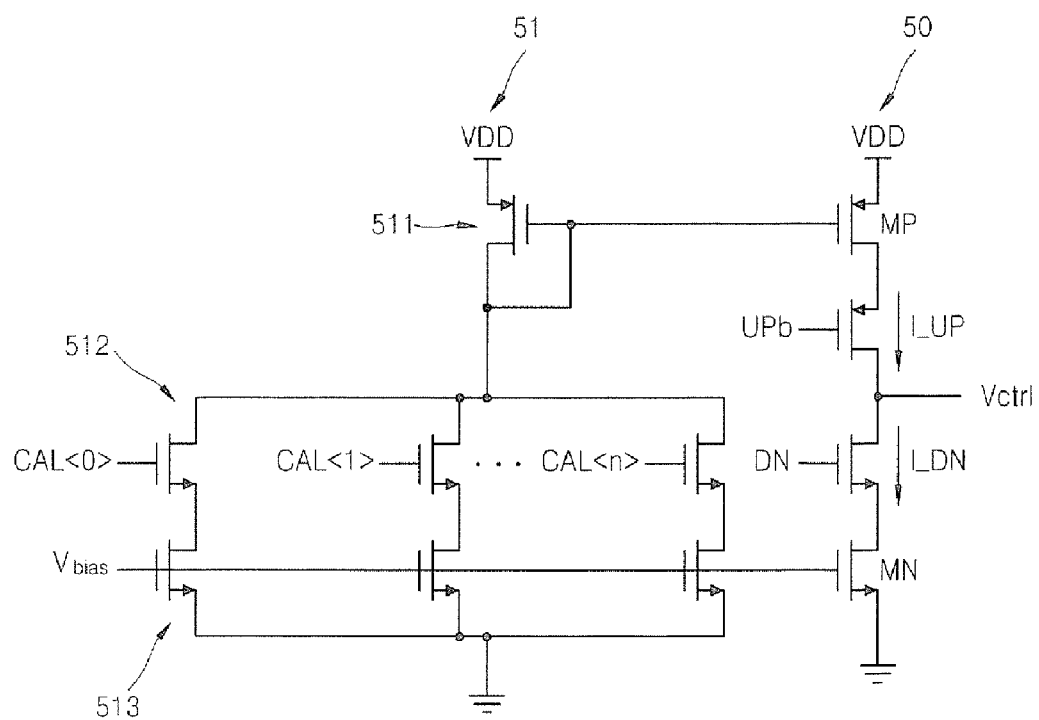
FIG. 5A is a circuit diagram of a charge pump mismatch calibrating apparatus according to an embodiment of the inventive concept.

FIG. 5A is a circuit diagram of a charge pump calibrated to match the currents I_UP and I_DN according to an embodiment of the inventive concept.

Referring to FIG. 5A, a calibration circuit 51 is connected to a bias input of the charge pump circuit 50 as illustrated in FIG. 1. The calibration circuit 51 includes a current mirror 511 and an NMOS switch bank. The NMOS switch bank includes NMOS switches 512 turned on/off according to a calibration signal output from the AFC 35 illustrated in FIG. 3 and an NMOS current source 513 driven by a bias voltage Vbias. The bias voltage Vbias is input as a voltage Vbias_n to the charge pump circuit 50 and the output of a PMOS diode 511 is input as a voltage Vbias_p to the charge pump circuit 50.

A dual embodiment of the circuit of FIG. 5A may be also considered. The dual embodiment circuit is illustrated in FIG. 5B.

Figure 5B:
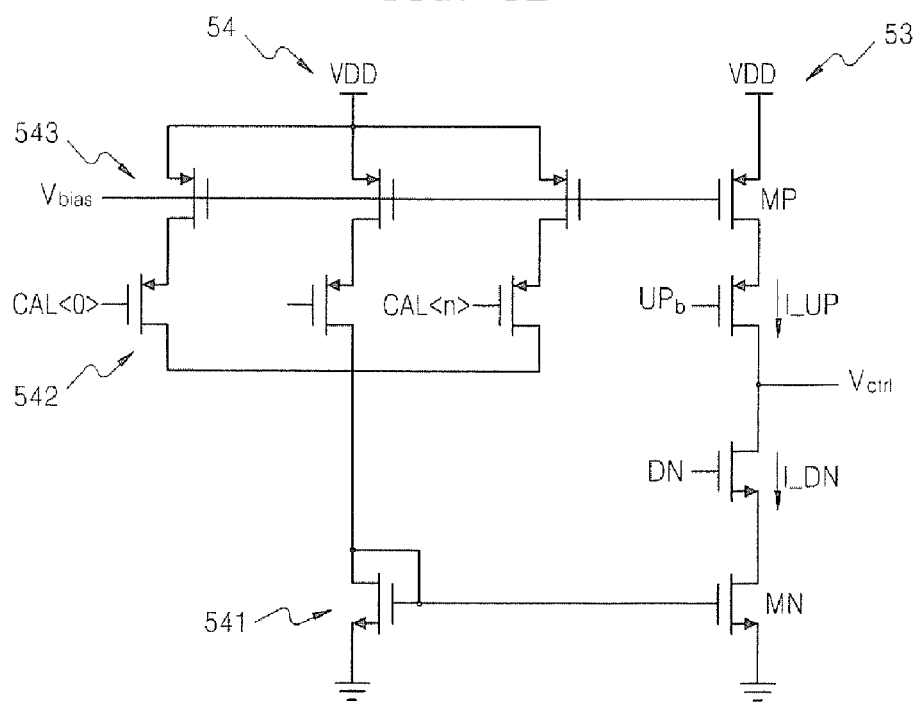
FIG. 5B is a dual circuit diagram of the circuit illustrated in FIG. 5A.

Referring to FIG. 5B, a calibration circuit 54 is connected to a bias input of the charge pump circuit 53. The calibration circuit 54 includes a current mirror 541 and a PMOS switch bank. The PMOS switch bank includes PMOS switches 542 turned on/off according to a calibration signal output from the AFC 35 illustrated in FIG. 3 and a PMOS current source 543 driven by a bias voltage Vbias. The bias voltage Vbias is input as a voltage Vbias_p to the charge pump circuit 53 and the output of an NMOS diode 541 is input as a voltage Vbias_n to the charge pump circuit 53.

Figure 6:
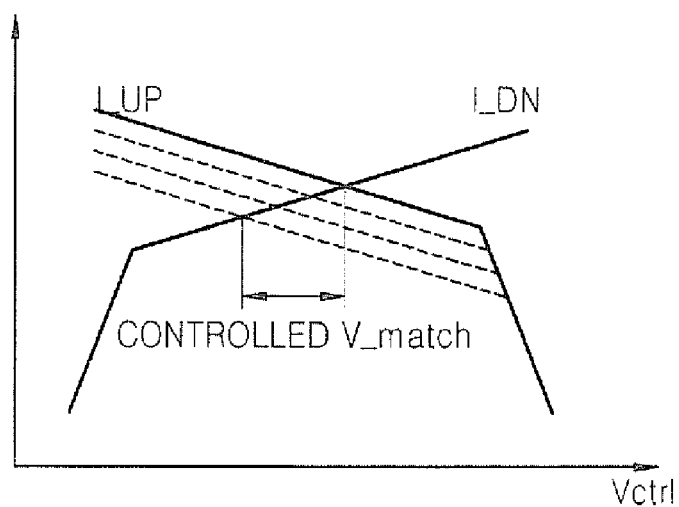
FIG. 6 is a graph illustrating a voltage V_match varying according to calibration of current I_UP in a charge pump calibration mode.

The AFC 35 can digitally calibrate the charge pump 33 if the charge pump illustrated in FIG. 5 is employed as the charge pump 33. FIG. 6 is a graph illustrating the voltage V_match varying according to calibration of the current I_UP in the charge pump calibration mode. The AFC 35 controls the calibration signal until the voltage V_match reaches the voltage V_lock to calibrate the current I_UP.

Calibration of the charge pump 33 is completed as described above, the selector 31 outputs the signal FB_CLK to the PFD 32 to operate the PLL. Here, the frequency divider 36 divides the frequency of the signal output from the VCO 34 in a predetermined ratio and outputs the divided frequency as the signal FB_CLK.

While the inventive concept has been particularly shown and described with reference to exemplary embodiments thereof, it will be understood that various changes in form and details may be made therein without departing from the spirit and scope of the following claims.

What is claimed is:

1. An integrated circuit device, comprising:
    a charge pump responsive to up and down control signals and first and second bias signals;
    a charge pump calibration circuit comprising:
        a current mirror configured to generate the first bias signal; and
        a current source circuit electrically connected to the current mirror and responsive to a multi-bit calibration signal; and
    a voltage-controlled oscillator configured to generate an output signal in response to a control signal generated by said charge pump; and
    a frequency calibrator responsive to the output signal, said frequency calibrator configured to change a value of the multi-bit calibration signal in response to detecting changes in a frequency of the output signal.

2. The device of claim 1, wherein the current source circuit is responsive to the second bias signal.

3. The device of claim 2, wherein the current source circuit comprises a plurality of parallel current sources responsive to respective ones of the multi-bit calibration signal.

4. The device of claim 3, wherein the current mirror comprises a PMOS transistor; and wherein each of the plurality of parallel current sources comprises a pair of NMOS transistors.

5. The device of claim 3, wherein the current mirror comprises an NMOS transistor; and wherein each of the plurality of parallel current sources comprises a pair of PMOS transistors.

6. The device of claim 1, further comprising a phase-frequency detector configured to generate the up and down control signals in response to a reference clock signal and a feedback clock signal.

7. The device of claim 6, further comprising a selector configured to pass the reference clock signal as the feedback clock signal in response to a calibration mode signal.

8. A phase-locked loop integrated circuit device, comprising:
- a charge pump responsive to up and down control signals and first and second bias signals;
- a charge pump calibration circuit configured to generate the first bias signal in response to a multi-bit calibration signal;
- a voltage-controlled oscillator configured to generate an output signal in response to a control signal generated by said charge pump; and
- a frequency calibrator responsive to the output signal, said frequency calibrator configured to change a value of the multi-bit calibration signal in response to detecting changes in a frequency of the output signal.

9. The device of claim 8, further comprising:
- a phase-frequency detector configured to generate the up and down control signals in response to a reference clock signal and a feedback clock signal; and
- a selector configured to pass the reference clock signal as the feedback clock signal in response to a calibration mode signal.

10. A charge pump calibrating apparatus for calibrating a charge pump, which receives two bias voltages and outputs a voltage corresponding to a difference between currents corresponding to two input voltages to flow through the charge pump such that the current difference is eliminated, the apparatus comprising:
- a phase frequency detector receiving two identical clock signals and outputting two signals corresponding to a phase difference between the two clock signals as the input signals of the charge pump;
- a voltage controlled oscillator outputting an oscillating signal according to the output voltage of the charge pump; and
- an automatic frequency calibrator receiving the oscillating signal from the voltage controlled oscillator and controlling the bias voltages of the charge pump such that a frequency of the oscillating signal output from the voltage controlled oscillator becomes a desired frequency.

11. The charge pump calibrating apparatus of claim 10, wherein the charge pump comprises:
- a current mirror connected to a first bias voltage terminal; and
- a current source connected to the current mirror and controlled according to an input signal.

12. The charge pump calibrating apparatus of claim 11, wherein the current source comprises:
- a plurality of switches connected to the current mirror and turned on/off respectively according to the input signal; and
- a plurality of current sources respectively connected to the plurality of switches.

13. The charge pump calibrating apparatus of claim 12, wherein the current source comprises a plurality of transistors driven by a bias voltage applied to a second bias voltage terminal.

14. The charge pump calibrating apparatus of claim 13, wherein whether the frequency of the oscillating signal output from the voltage controlled oscillator becomes identical to the desired frequency is determined by that a number of clock pulses of the oscillating signal for a predetermined period of time is counted and it is determined whether the counted number equals to a predetermined value.

15. A phase locked loop comprising:
- a selector selectively outputting a first clock signal or a second clock signal according to a selected mode;
- a phase frequency detector receiving the first clock signal and an output signal of the selector and outputting two signals corresponding to a phase difference between the received clock signals;
- a charge pump receiving two bias voltages and outputting a voltage corresponding to a difference between currents corresponding to the two signals output from the phase frequency detector to flow through the charge pump;
- a voltage controlled oscillator outputting an oscillating signal according to the voltage output from the charge pump;
- an automatic frequency calibrator receiving the oscillating signal from the voltage controlled oscillator and calibrating the bias voltages of the charge pump such that a frequency of the oscillating signal output from the voltage controlled oscillator becomes identical to a desired frequency when the first clock signal is output from the selector; and a frequency divider dividing the frequency of the oscillating signal output from the voltage controlled oscillator and supplying the divided frequency to the selector as the second clock signal when the second clock signal is output from the selector.

* * * * *